(12) United States Patent  (10) Patent No.: US 6,875,284 B2
Scranton  (45) Date of Patent: Apr. 5, 2005

(54) SIDE-SPECIFIC CLEANING METHOD AND APPARATUS

(75) Inventor: Dana Scranton, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 395 days.

(21) Appl. No.: 10/055,302

(22) Filed: Jan. 23, 2002

(65) Prior Publication Data

US 2003/0136422 A1 Jul. 24, 2003

(51) Int. Cl.[7] .............................. B08B 3/00; B08B 3/12
(52) U.S. Cl. .............................. 134/1; 134/26; 134/28; 134/32
(58) Field of Search .............................. 134/26, 28, 1, 134/32, 33; 438/745, 749

(56) References Cited

U.S. PATENT DOCUMENTS

| | | | | |
|---|---|---|---|---|
| 4,113,492 A | * | 9/1978 | Sato et al. .............. | 430/271.1 |
| 5,264,339 A | * | 11/1993 | Tavernier et al. .......... | 430/621 |
| 6,100,198 A | * | 8/2000 | Grieger et al. ............ | 438/692 |
| 6,511,914 B2 | * | 1/2003 | Wirth et al. .............. | 438/694 |
| 6,632,292 B1 | * | 10/2003 | Aegerter et al. ............. | 134/33 |
| 2001/0013355 A1 | | 8/2001 | Busnaina | |

* cited by examiner

*Primary Examiner*—Michael Barr
*Assistant Examiner*—Saeed Chaudhry
(74) *Attorney, Agent, or Firm*—Perkins Coie LLP

(57) ABSTRACT

A device for the side-specific cleaning of a microelectronic workpiece having a front side, a back side, and an edge includes a chamber, a fixture within the chamber that is adapted to hold one or more microelectronic workpieces. At least one transducer is located within the chamber and preferably adjacent to the edge of the microelectronic workpiece. The method includes the steps of immersing the front side, back side, and edge of the microelectronic workpiece in a first processing fluid while preferably rotating the microelectronic workpiece. The microelectronic workpiece is then rinsed and dried and immersed in a second processing fluid such that the back side and edge of the microelectronic workpiece are immersed in the second processing fluid, while preferably rotating the microelectronic workpiece, without exposing the front surface of the microelectronic workpiece to the second processing fluid. Vibrational energy, preferably in the form of megasonics, is introduced during at least one of the immersions steps.

21 Claims, 7 Drawing Sheets

SIDE-SPECIFIC CLEANING METHOD AND APPARATUS

FIELD OF THE INVENTION

The field of the invention is cleaning of microelectronic workpieces. More specifically, the field of the invention relates to methods and devices that selectively clean various surfaces of a microelectronic workpiece. A microelectronic workpiece is defined here to include a workpiece formed from a substrate on which microelectronic circuits or components, data storage elements or layers, or micro-mechanical or optical elements are formed.

BACKGROUND OF THE INVENTION

During the processing of microelectronic workpieces into, for example, electronic devices such as integrated circuits, it is necessary to clean the surface of the workpiece by removing contaminants. Contaminants not removed during cleaning process tend to reduce the overall yield of the manufacturing process. This reduces the number of usable electronic components, such as integrated circuits, microprocessors, memory devices, etc. that can be obtained from a workpiece.

During the processing of microelectronic workpieces, chemical-mechanical polishing ("CMP") is sometimes employed to planarize or polish the surface layers of the microelectronic workpiece. Typically, during the CMP process, the microelectronic workpiece is typically pressed against a slurry on a polishing pad under controlled conditions. The slurry used in the CMP process generally includes small, abrasive particles that mechanically remove the surface layer of the microelectronic workpiece. The slurry also contains chemicals that chemically remove the surface layer. After the microelectronic workpiece is polished, it is necessary to remove the residual particles on the surface of the microelectronic workpiece that were introduced during the CMP process. Contaminants may be introduced by the slurry, the polishing pad, or from features formed on the microelectronic workpiece. These contaminants are removed in a post-CMP cleaning process.

Current post-CMP cleaning processes have typically employed a brush scrub, spray cleaning, or immersion process to remove the contaminants introduced during the CMP process. Each of these post-CMP cleaning processes, however, have particular problems when the microelectronic workpiece includes copper (Cu) features. In recent years, microelectronic workpieces having copper-based features have been increasingly used because of copper's ability to efficiently and quickly transmit electrical current. The copper ion, however, is a highly mobile contaminant that poses particular problems for post-CMP cleaning processes.

Brush scrubbing is not favored for post-CMP cleaning of microelectronic workpieces containing copper because the scrubbing can damage the surface of the microelectronic workpiece. Since copper is relatively soft compared to other interconnect materials, aggressive brush scrubbing of the microelectronic workpiece can cause scratching or smearing of the copper features. Brush scrubbing may also further imbed particles into the surfaces of the copper features. Moreover, brush scrubbing is not able to adequately remove contaminants that are located on the edge region of the microelectronic workpiece.

Immersion techniques may avoid these drawbacks. However, as they generally use recirculated chemicals, they may cause unwanted copper redeposition.

Spray cleaning may avoid the disadvantages of both brush and immersion cleaning. However, spray cleaning may not be as effective in cleaning the microelectronic workpiece.

As copper ion's are highly mobile, they can also easily contaminate fabrication equipment. For example, copper contamination on the back side of the microelectronic workpiece can be transported to wafer handlers, indexers and chucks. Copper contamination can also be transported to cassettes, boxes, and indexer devices.

Accordingly, there remains a need for improved post-CMP cleaning methods and devices for cleaning copper from the front, back, and edge of a microelectronic workpiece, while maintaining the integrity of the copper features on the microelectronic workpiece. A method and apparatus is needed for reducing particle contamination from the sides and edge of the microelectronic workpiece without damage to the copper features that are typically located on the front side of the microelectronic workpiece. There is also a need at the same time to keep copper oxide at low levels.

SUMMARY OF THE INVENTION

In a first aspect of the invention, a processor for processing a microelectronic workpiece includes a chamber, a fixture within the chamber adapted to hold a microelectronic workpiece, and at least one transducer within the chamber and located adjacent to the edge of the microelectronic workpiece.

In a second, separate aspect of the invention, independent of any apparatus aspects or elements, a method for processing a microelectronic workpiece includes the steps of immersing the front side, back side, and edge of the workpiece with a first processing fluid. The workpiece is then rinsed and dried. Next, the workpiece is advantageously partially immersed in a second processing fluid such that the back side and edge of the microelectronic workpiece are exposed to the processing fluid while the front side is not exposed to the processing fluid. Vibrational energy is introduced to the microelectronic workpiece during at least one of the immersion steps.

In a third aspect, the method of the second aspect includes the steps of placing the workpiece within a chamber and rotating the workpiece during the immersion steps.

It is an object of the invention to provide improved methods and apparatus for the process of microelectronic workpieces.

The invention resides as well in subcombinations of the features and steps described. The invention broadly contemplates devices and methods for performing differential cleaning on the various surfaces of a microelectronic workpiece.

DETAILED DESCRIPTION

Figure 1:
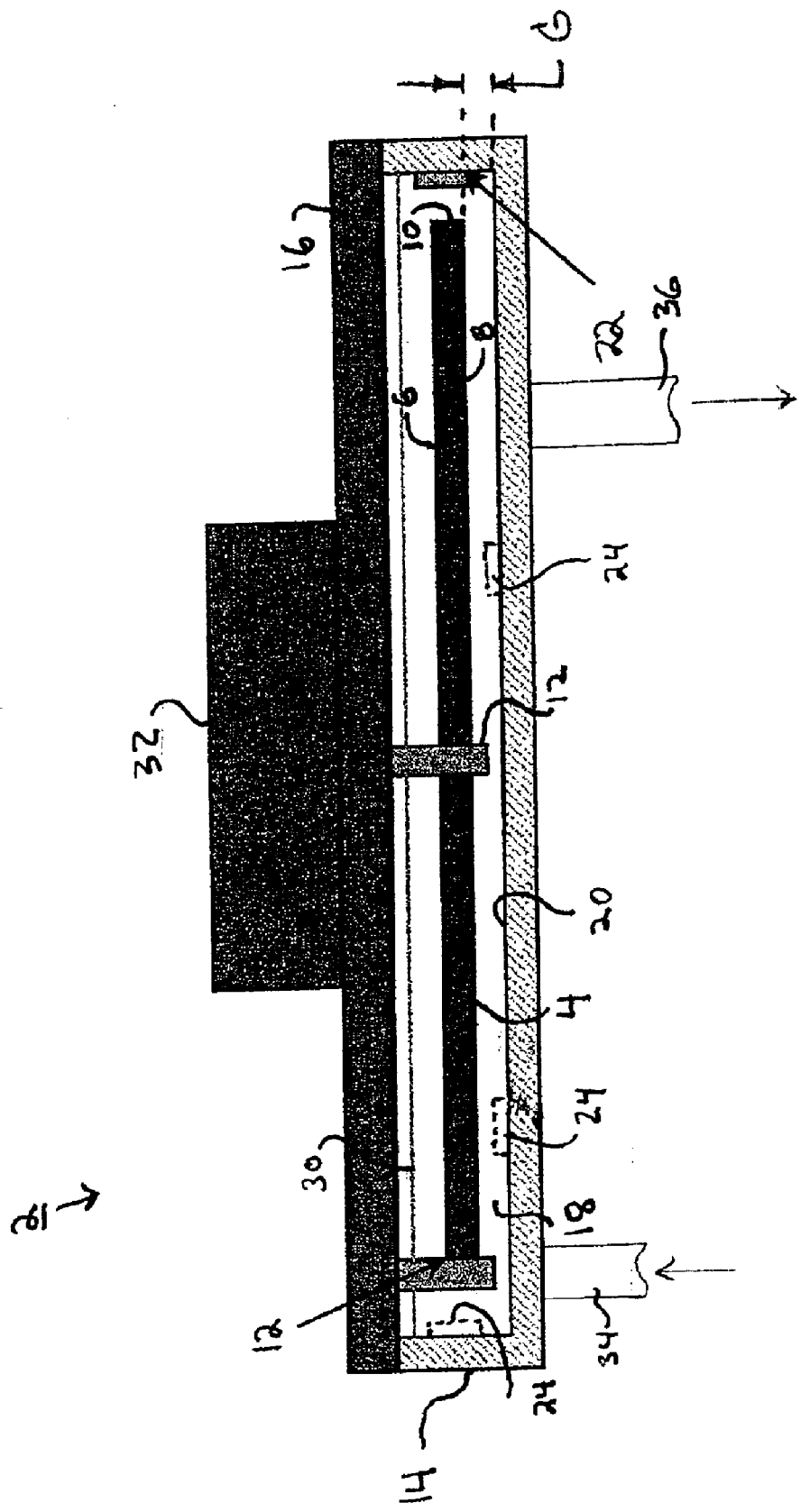
FIG. 1 is side cut-away view of the microelectronic workpiece processor.

FIG. 1 illustrates the processor 2 containing a single microelectronic workpiece 4 The microelectronic workpiece includes a front side 6, a back side 8, and an edge 10. The microelectronic workpiece 4 is held within a fixture 12 located within the inside portion of the processor 2. The processor 2 preferably includes an immersion chamber 14 and lid 16. The term "immersion chamber" here means walls forming a confined space for at least partially containing a processing fluid 30. The lid 16 is preferably removable from the immersion chamber 14 such that the microelectronic workpiece 4 can be loaded and unloaded from the processor 2. The lid 16 can also open by other means (e.g., pivoting, sliding, etc.). For some applications, the lid 16 is not necessary and may be omitted.

The immersion chamber 14 preferably has a shallow depth such that a narrow gap 18 is formed between the lowermost inner surface 20 of the immersion chamber 14 and the back side 8 of the microelectronic workpiece 4. Preferably, the gap 18 has a height or dimension G ranging from 0.01 to 0.50 inches, or 0.02 to 0.2 or 0.25 inches, and more preferably from 0.03 to 0.10 inches. The immersion chamber 14 is also preferably made of PTFE (polytetrafluoroethylene) to dampen acoustic energy used in processing.

At least one transducer 22 is located within the immersion chamber 14. The transducer 22 emits vibrational or sonic energy toward the microelectronic workpiece 4. The vibrational energy is preferably in the form of megasonics. Preferably, the transducer 22 is located within the immersion chamber 14 and adjacent to the edge of the microelectronic workpiece 4. The immersion chamber 14 may optionally also include additional transducers 24 located adjacent to the edge of the microelectronic workpiece 4 or underneath the back side 8 of the microelectronic workpiece 4.

FIG. 1 shows the microelectronic workpiece 4 immersed in a processing fluid 30. In FIG. 1, the front side 6, back side 8, and edges 10 of the microelectronic workpiece 4 are all in contact with the processing fluid 30. This corresponds to the "rough" cleaning step described in the more detail below, wherein bulk contamination is removed.

The processor 2 includes an inlet 34 and an outlet 36 that are used to fill and empty, respectively, the immersion chamber 14 with processing fluid 30. A motor 32 is preferably positioned on the lid 16 of the immersion chamber 14. The motor 32 is connected to the fixture 12 for rotating the fixture 12 and the workpiece 4 held in the fixture.

Figure 2:
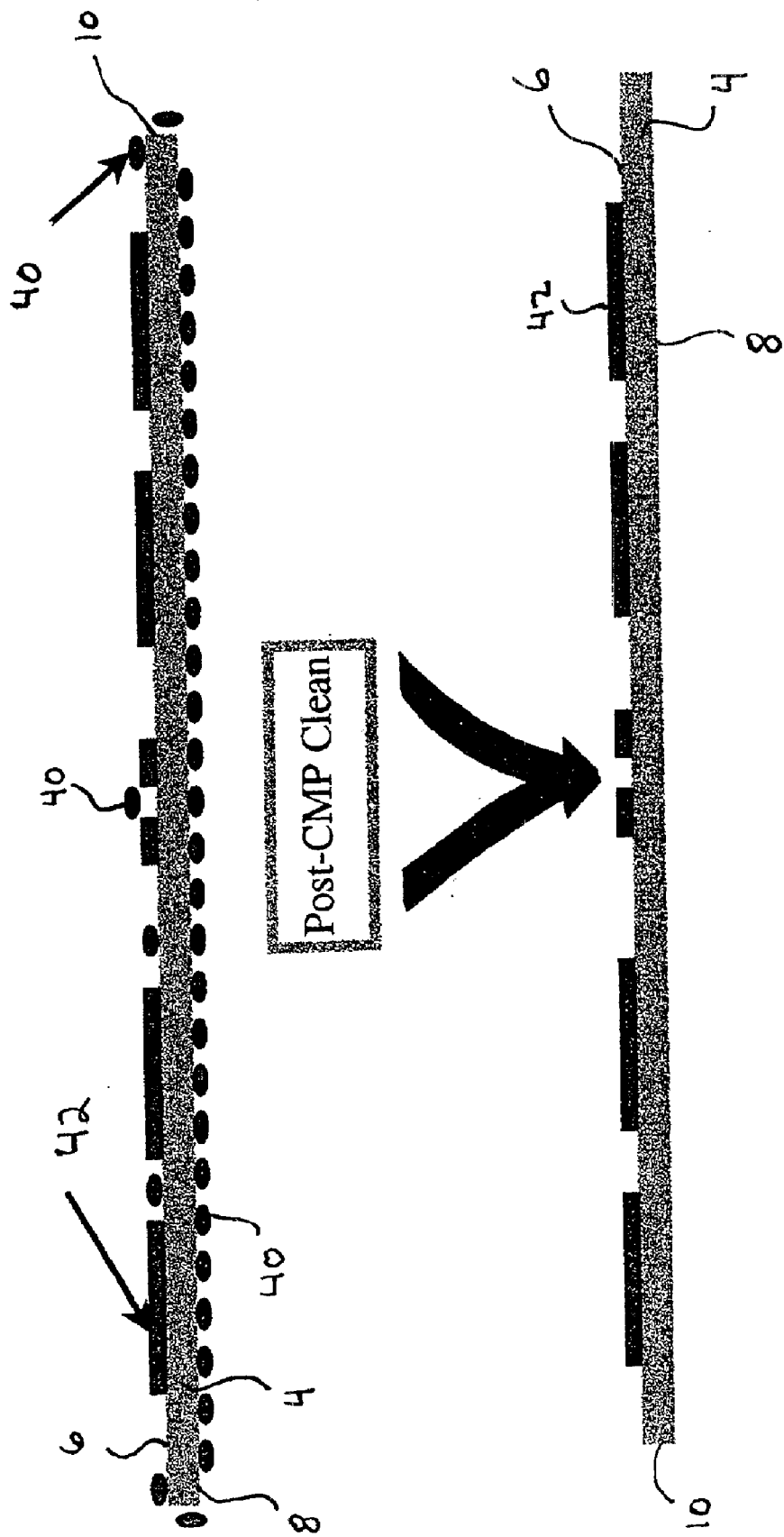
FIG. 2 is a schematic representation of the microelectronic workpiece undergoing post-CMP cleaning.
Figure 3:
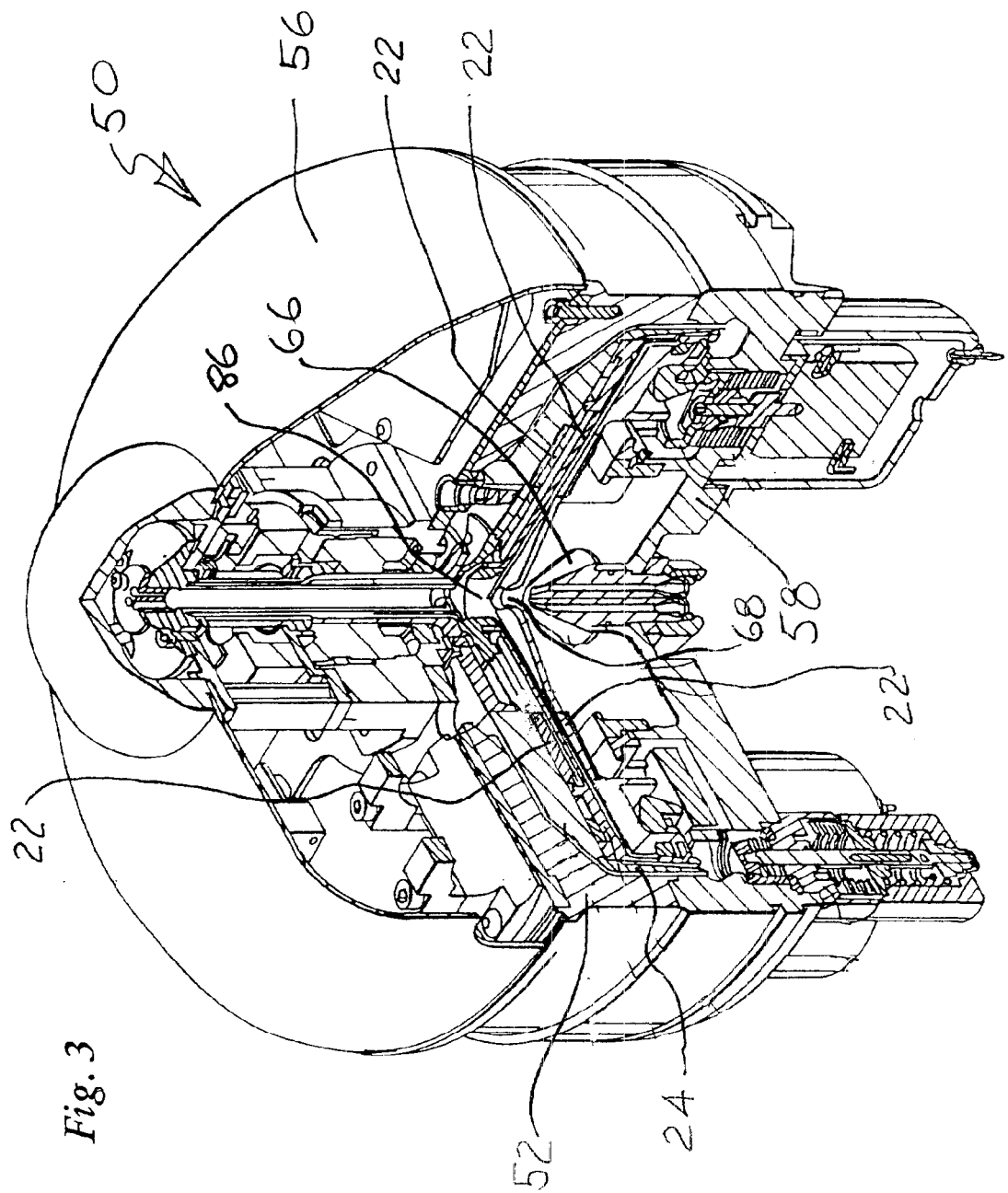
FIG. 3 is a cut-away perspective view of a second embodiment.

With reference to FIGS. 1 and 2, a description of the operation of the processor will now be given. Initially, the workpiece 4 is loaded within the processor 2. Preferably, the fixture 12 holds a single microelectronic workpiece 4. However, a multiple position fixture may be used to hold multiple workpieces 4. The workpiece 4 is suspended within the immersion chamber 14. The back side 8 of the workpiece 4 and the lowermost inner surface 20 of the immersion chamber 14 are spaced apart by the gap 18.

When the workpiece 4 is secured within the processor 2, a processing fluid 30 is introduced to the immersion chamber 14. This first processing fluid 30 bathes the front side 6, the back side 8, and the edge 10 of the microelectronic workpiece 4. Preferably, this first processing fluid 30 includes a dilute solution containing $H_2SO_4$, HF, or tetramethylammonium hydroxide (TMAH). Of course, other non-aggressive cleaning agents can also be employed that do not aggressively react with the metallic features of the microelectronic workpiece 4. This first cleaning is a "rough" cleaning step that is directed to cleaning the front side 6 of the workpiece 4. In this step, exposure of the processing fluid 30 to the back side 8 of the microelectronic workpiece 4 is not detrimental. Consequently, whether the back side 8 is exposed to the processing fluid is not significant. During this "rough" cleaning step, the workpiece 4 is preferably rotated within the processor 2 via the motor 32. Spinning the microelectronic workpiece 4 provides better process uniformity. The transducers 22 and/or 24 are preferably used to introduce vibrational energy to the microelectronic workpiece 4 through the processing fluid 30 to assist in cleaning the workpiece. Spinning helps to control the thickness of the liquid boundary layer formed on the workpiece. Spinning the workpiece also helps to distribute sonic energy across the surface of the workpiece, especially when the transducers are located around the outside edge perimeter or circumference of the workpiece. When the transducers are on the top or bottom of the chamber (away or inward from the circumference), spinning is less significant and can be omitted. The circumferential transducers 2A and the top/bottom transducers 22 may be selectively switched on and off, or provide varying intensity sonic energy, typically to provide different processing characteristics to top and bottom sides of the workpiece.

Next, the front side 6, back side 8, and edge 10 of the microelectronic workpiece 4 are rinsed and dried with a rinsing fluid (i.e., liquid and/or gas or vapor). The rinsing fluid is introduced via the inlet 34 and removed via the outlet 36. The workpiece 4 may optionally be spun during the rinsing and drying steps.

A second processing fluid 31 is then introduced into the immersion chamber 14. This second processing fluid 31 is introduced to the immersion chamber 14 such that only the back side 8 and edge 10 of the microelectronic workpiece 4 are in contact with the processing fluid 31. The edge 10 is defined here to include the bevel portion, if any, of the workpiece 4. This second processing fluid 31 is more aggressive than the processing fluid 30 used in the "rough" cleaning step to remove copper ions/particles 40. Preferably, the second processing fluid 31 can include a mixture of HF and $H_2O_2$. Of course, other processing fluids that are aggressive to metals, such as copper, can also be used. This step is referred to as a "fine" cleaning step because the cleaning is directed only to the back side 8 and edge 10 of the microelectronic workpiece 4. During this "fine" cleaning step, the microelectronic workpiece 4 is also preferably rotated within the processor 2. The transducers 22 or 24 preferably provide vibrational energy to microelectronic workpiece 4 through the processing fluid 30 to aid in cleaning the workpiece.

Following the "fine" cleaning step, the front side 6, back side 8, and edges of the workpiece 4 are rinsed and dried with a rinsing fluid. The rinsing fluid is introduced via the inlet 34 and removed via the outlet 36. The microelectronic workpiece 4 may be optionally rotated during the rinsing and drying steps. After the rinse step, the workpiece 4 may undergo optional passivation with ozone.

FIG. 2 schematically illustrates the effects of the cleaning process. Prior to the post-CMP cleaning process, copper ion/particles 40 are disposed on the front side 6, back side 8, and edge 10 of the microelectronic workpiece 4. In addition, copper ion/particles 40 are located on top of and in between the copper features 42 on the front side 6 of the workpiece 4. The rough cleaning step removes copper ion particles 40 on the front side 6 (as well as, to a certain extent, the back side 8, and edge 10) of the workpiece 4. The "fine" cleaning step is directed at the back side 8 and edge 10 of the microelectronic workpiece 4. After the post-CMP cleaning process, the workpiece 4 is cleaned of copper ion particles 40 while the copper features 42 on the workpiece 4 remain intact.

In a typical method, the wafer or workpiece undergoes megasonic cleaning while immersed in an ammonium hydroxide solution for about 1–8, 3–7 or 4–6 and preferably about 5 minutes. The solution is recirculated and filtered. The wafer is then immersed in water with megasonic cleaning for a similar time interval, and with 1–4 or 2–3 dump cycles. Next the wafer is brush scrubbed with about a 50–250, 75–150, or 100 rpm brush, and a 30–120, 45–90 or 60 rpm wafer, for about 10–60, 20–45 or 30 seconds, while also applying ammonium hydroxide solution. The wafer is then rinsed and spin dried at 500–2500, 1000–2200 or 1500–2000 rpm, while applying water and then nitrogen or air, for abut 60–300, 90–180, or 120 seconds.

If the workpiece 4 is rotated within the processor 2, it is preferable to position the transducers 22 and/or 24 along the sides of the immersion chamber 14, near the gap 18. If the workpiece 4 is fixed in place, it is preferable to also locate transducers 24 on the bottom of the immersion chamber 14 opposite the back side 8 of the workpiece 4.

The transducers 22 and/or 24 may be turned on simultaneously, or they may be switched on and off at different times during processing. The system and methods provide for post-CMP cleaning in an integrated system. This allows for consistent and repeatable cleaning. In addition, as multiple processes are performed within a single chamber, fewer workpiece transfers are needed between other systems. The space required for processing machines, i.e., the overall footprint, is reduced. Processing waiting times are also reduced. An advantage of the methods described is that cleaning the front side with a highly effective technique does not affect the back side. The methods can be performed in single or multiple chambers.

Figure 6:
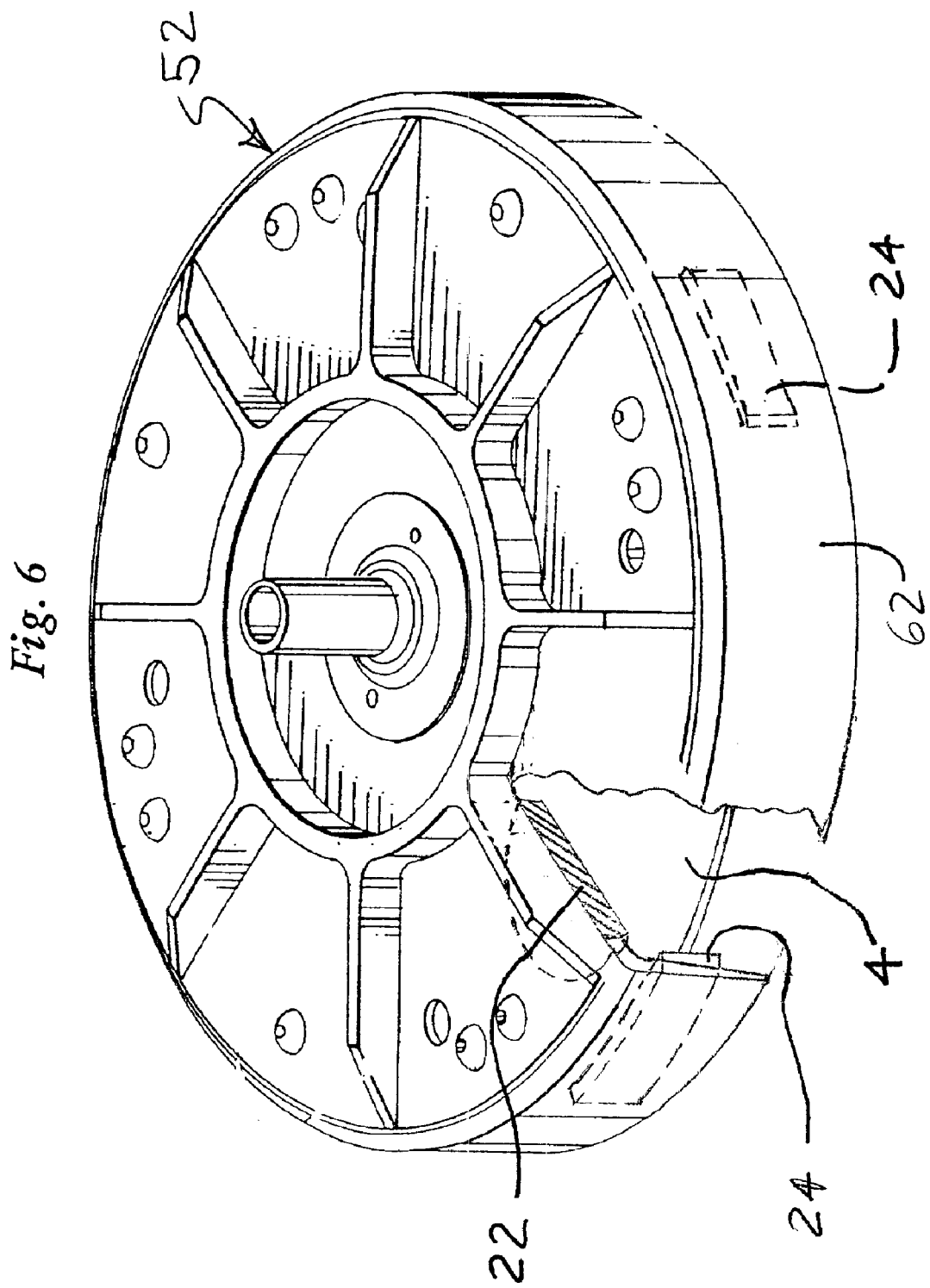
FIG. 6 is a perspective view of the upper rotor showing FIGS. 3 and 4.

A preferred apparatus 50 is shown in FIGS. 3–6. The design and operation of the apparatus 50 is described in International Patent Application WO 99/46065, incorporated herein by reference, with the following changes. Transducers 22 are installed in openings or cutouts in the interior chamber member or rotor face 60 of the lower rotor 54. Wiring connecting to the transducers passes through slip rings or an equivalent device and extend out through the base 58 of the apparatus 50 to a power source. As the transducers 22 are on the lower rotor 54, they rotate with the wafer 4. Consequently, as there is no relative movement between the wafer 4 and the transducers 22, an array of transducers, such as 3, 4, 5, 6, 7, or 8 transducers 22 may be used, to provide sonic energy to all areas of the workpiece lower surface. A similar array of transducers 22 may optionally be provided in the upper rotor 52, as shown in FIG. 6. Edge transducers 24 may also be provided at the perimeter or edge of the wafer 4, on the skirt or flange 62 of the upper rotor 52. Again, as the edge transducers 24 spin with the workpiece, an array of edge transducers may similarly be used.

Figure 4:
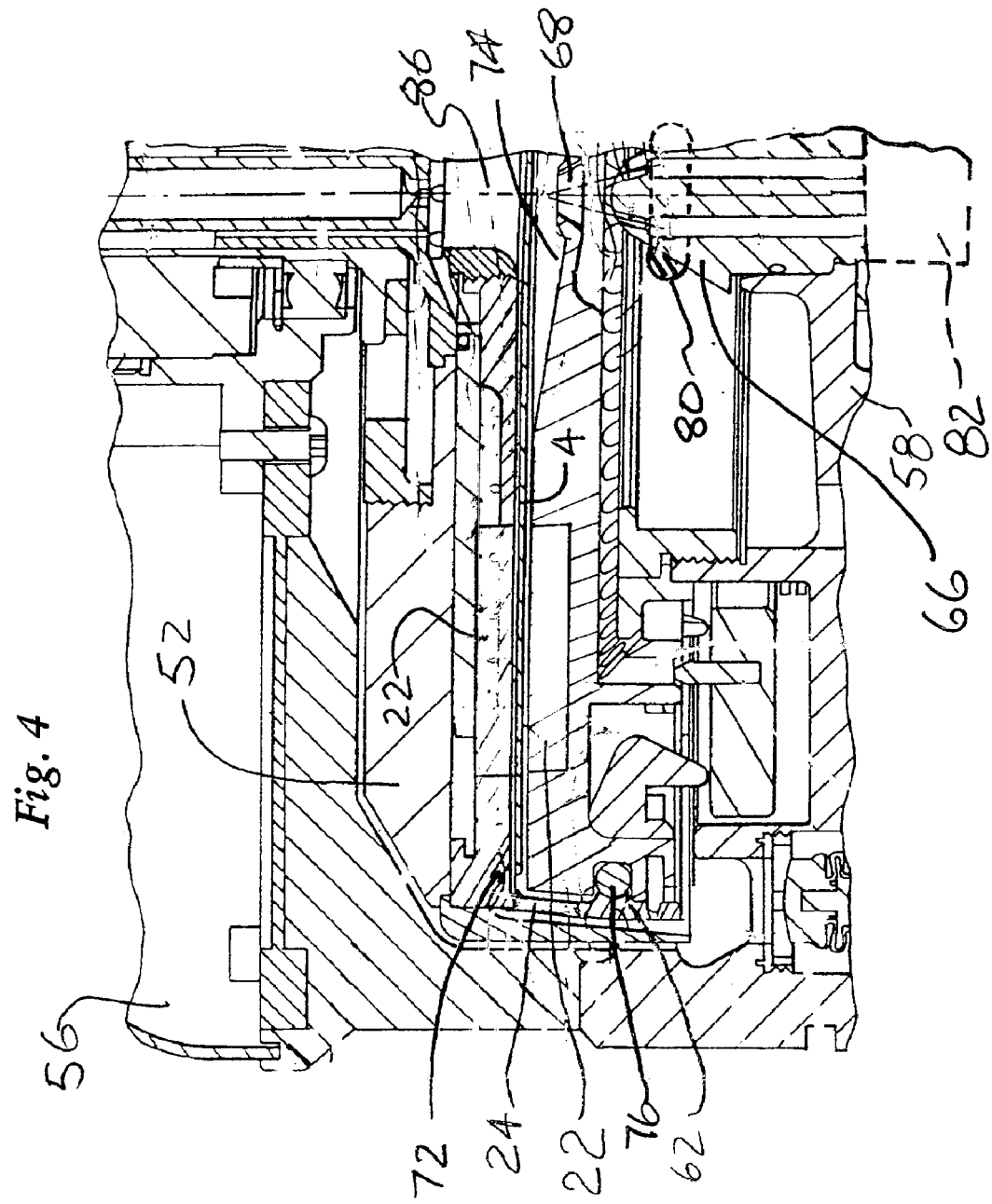
FIG. 4 is an enlarged detail view of components shown in FIG. 3.
Figure 5:
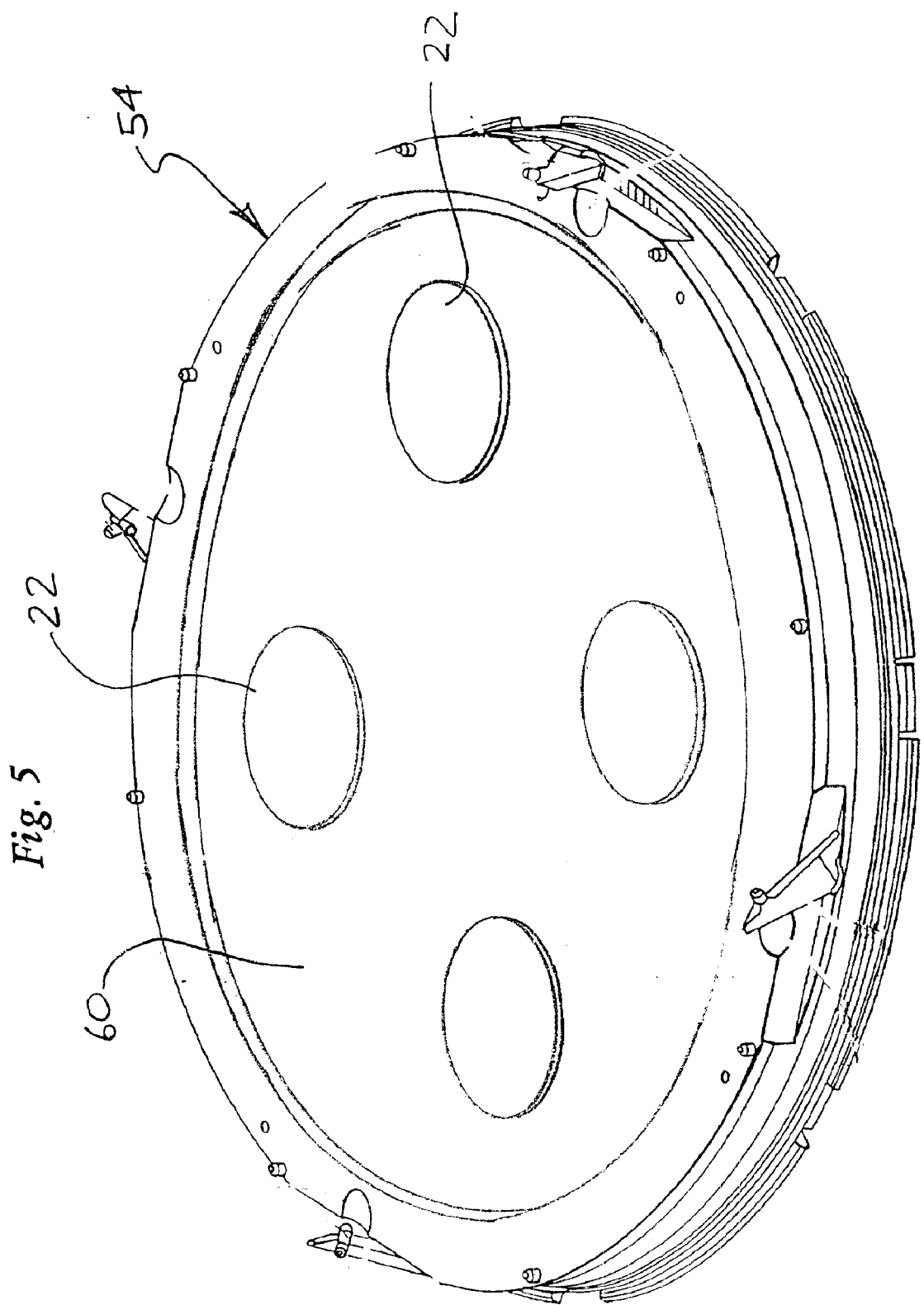
FIG. 5 is a perspective view of the lower rotor shown in FIGS. 3 and 4.
Figure 7:
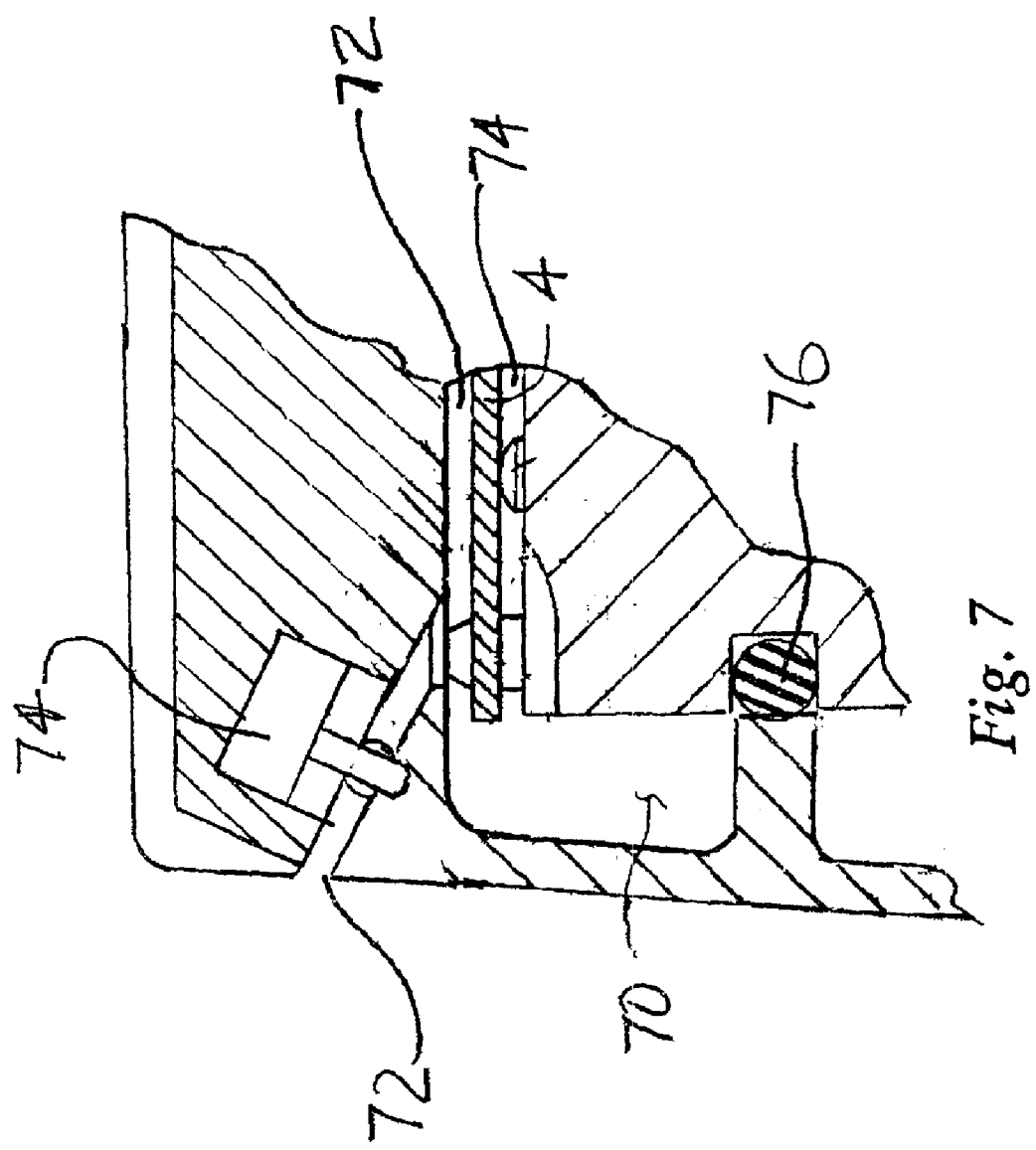
FIG. 7 is an enlarged partial section view of an alternative design for immersion processing.

FIGS. 4 and 7 show a further modification of the apparatus in WO 99/46065 to provide for immersion processing. As shown in FIG. 7, outlet valves 74 are located in the outlets 72. As shown in FIG. 4, a stopper 80 is positioned around the lower nozzle 66 on a stopper actuator 82, at the lower inlet 68. The o-ring 76 between the upper and lower rotors 52 and 54 prevents any flow downwardly out of the annular chamber 70, when the rotors are engaged together for processing.

To provide immersion processing, the outlet valves 74 are closed. The stopper actuator 82 moves the stopper 80 up into the lower inlet 68, closing off the inlet 68. The workpiece chamber enclosing the workpiece, i.e., the interconnected upper chamber 72, lower chamber 74 and the annular chamber 70, are closed or sealed. The only opening into the workpiece chamber is the upper inlet 86. Fluid is supplied into the upper inlet 86 until the desired fluid level for immersion is reached in the workpiece chamber. The fluid level is maintained for a sufficient time to achieve immersion processing. The outlet valves 74 are then opened. The fluid moves out of the workpiece chamber via the centrifugal force created by the spinning chamber. The stopper actuator 82 then moves the stopper 80 back down, to allow fluids (gas or liquid to introduced into the workpiece chamber). One or more outlets 72 and valves 74 may be used.

In an alternative embodiment, the stopper and stopper actuator can be omitted. In this embodiment, centrifugal force keeps the fluid away from the lower inlet 68, so that no stopper is needed. Alternatively, the lower inlet 68 can be continuous with or permanently attached (i.e., in a fixed position) to the lower rotor 54. The upper inlet 86 need not be modified for immersion processing, as gravity prevents fluid from moving out of the workpiece chamber.

The outlet valves 74 and stopper actuator 82 (if used) may be pneumatically, mechanically or electrically actuated. The outlet valves 74 may each have individual actuators, or they may be ganged or mechanically linked to a single master actuator. Outlets 72 and valves 74 may similarly be provided only in the lower rotor 54, in place of outlets in the upper rotor 52, or in addition to them.

While embodiments of the present invention have been shown and described, various modifications may be made without departing from the scope of the invention. The invention, therefore, should not be limited, except to the following claims, and their equivalents.

What is claimed is:

1. A method for processing a microelectronic workpiece having a front side, a back side, and an edge comprising the steps of:

placing the microelectronic workpiece into a chamber, immersing the front side, back side, and edge of the microelectronic workpiece within a first processing fluid while rotating the microelectronic workpiece;

rinsing and drying the microelectronic workpiece;

immersing the back side and edge of the microelectronic workpiece with a second processing fluid while rotating the microelectronic workpiece such that the front side of the microelectronic workpiece is not exposed to the second processing fluid; and rinsing and drying the microelectronic workpiece.

2. The method according to claim 1, further comprising the step of introducing vibrational energy to the chamber during the step of immersing the microelectronic workpiece within the first processing fluid.

3. The method of claim 2, wherein the vibrational energy is introduced adjacent to the edge of the microelectronic workpiece.

4. The method of claim 2, the vibrational energy is introduced adjacent to the back side of the microelectronic workpiece.

5. The method according to claim 1, further comprising the step of introducing vibrational energy to the chamber during the step of immersing the microelectronic workpiece with the second processing fluid.

6. The method of claim 5, wherein the vibrational energy is introduced adjacent to the edge of the microelectronic workpiece.

7. The method of claim 5, wherein the vibrational energy is introduced adjacent to the back side of the microelectronic workpiece.

8. The method according to claim 1, wherein the first processing fluid includes a reactive agent selected from the group consisting of $H_2SO_4$, HF, and TMAH.

9. The method according to claim 1, wherein the second processing fluid comprises a mixture of HF and $H_2O_2$.

10. The method of claim 1, further comprising the step of rotating the microelectronic workpiece during one or both of the rinsing and drying steps.

11. A method for processing a workpiece having a front side, a back side, and an edge comprising the steps of:
- immersing the front side, back side, and edge of the microelectronic workpiece into a first processing fluid;
- rinsing the workpiece
- immersing the back side and edge of the workpiece into a second processing fluid with the front side of the workpiece not exposed to the second processing fluid; and
- rotating the workpiece during at least one of the immersing steps.

12. The method according to claim 11, further comprising the step of introducing vibrational energy to the workpiece during at least one of the immersing steps.

13. The method of claim 12, wherein the vibrational energy is introduced adjacent to the edge of the workpiece.

14. The method of claim 12, wherein the vibrational energy is introduced adjacent to the back side of the workpiece.

15. The method according to claim 11, further comprising the step of treating the workpiece with ozone.

16. The method according to claim 11, wherein the second processing fluid comprises mixture of HF and $H_2O_2$.

17. The method of claim 11 further comprising the step of rinsing and drying the workpiece, after immersing the back side and edge into the second processing fluid.

18. The method of claim 17 further comprising the step of drying the workpiece after the first rinsing step.

19. The method of claim 18, further comprising the step of rotating the workpiece during one or both of the rinsing and drying steps.

20. The method of claim 11, further including the step of switching the vibrational energy on and off.

21. The method of claim 11, further including the step of varying the intensity of the vibrational energy.

* * * * *